United States Patent [19]
Chuang

[11] Patent Number: 5,334,886
[45] Date of Patent: Aug. 2, 1994

[54] DIRECT-COUPLED PNP TRANSISTOR PULL-UP ECL CIRCUITS AND DIRECT-COUPLED COMPLEMENTARY PUSH-PULL ECL CIRCUITS

[75] Inventor: Ching-Te K. Chuang, South Salem, N.Y.

[73] Assignee: International Business Machines Corporation, Armonk, N.Y.

[21] Appl. No.: 976,088

[22] Filed: Nov. 13, 1992

[51] Int. Cl.$^5$ .................. H03K 19/086; H03K 19/003
[52] U.S. Cl. ..................... 307/455; 307/456; 307/443
[58] Field of Search ............... 307/455, 456, 443, 446

[56] References Cited

U.S. PATENT DOCUMENTS

| | | | |
|---|---|---|---|
| 4,339,674 | 7/1982 | Hashimoto | 307/362 |
| 4,355,245 | 10/1982 | Isogai | 307/455 |
| 4,430,580 | 2/1984 | Lovelace | 307/288 |
| 4,451,746 | 5/1984 | Hirose et al. | 307/494 |
| 4,536,665 | 8/1985 | Dayton | 307/455 |
| 4,577,121 | 3/1986 | Sano et al. | 307/355 |
| 4,713,560 | 12/1987 | Herndon | 307/455 |
| 4,970,416 | 11/1990 | Tamegaya | 307/455 |
| 5,025,180 | 6/1991 | Kim et al. | 307/475 |
| 5,041,743 | 8/1991 | Matsumoto | 307/455 |
| 5,089,724 | 2/1992 | Chuang et al. | 307/454 |
| 5,122,683 | 6/1992 | Sugoh et al. | 307/455 |

OTHER PUBLICATIONS

C. K. Chuang et al "High-Speed ECL Circuit", IBM Technical Disclosure Bulletin, vol. 32 No. 4A, Sep. 1989, pp. 374–380.

C. T. K. Chuang "High-Speed/Low-Power Charge-Buffered Active-Pull-Down ECL/NTL Circuts" IBM Technical Disclosure Bulletin, vol. 33, No. 1A, Jun. 1990, pp. 470–472.

C. T. K. Chuang "High-Speed Low-Power ECL Circuit With An AC-Coupled Transient Current Source" IBM Technical Disclosure Bulletin, vol. 33, No. 10B, Mar. 1991, pp. 31–33.

C. T. K. Chuang, "High-Speed, Low-Power ECL Circuit With A Darlington-Like Transient Current Source and Active-Pull Down Driving Stage", IBM Technical Disclosure Bulletin vol. 33, No. 11, Apr. 1991, pp. 252–254.

Primary Examiner—Edward P. Westin
Assistant Examiner—Jon Santamauro
Attorney, Agent, or Firm—Philip J. Feig; David Aker

[57] ABSTRACT

An emitter coupled logic circuit includes a series connected PNP transistor and diode to improve the pull-up delay and power consumption. The biasing of the PNP transistor is established by utilizing existing voltage levels in the emitter coupled logic circuit with no extra biasing circuit and power. Complementary push-pull emitter coupled logic circuit configurations with no power wasted in the biasing of the push-and-pull transistors can be derived based on this PNP pull-up scheme and NPN active-pull-down scheme.

8 Claims, 1 Drawing Sheet

DIRECT-COUPLED PNP TRANSISTOR PULL-UP ECL CIRCUITS AND DIRECT-COUPLED COMPLEMENTARY PUSH-PULL ECL CIRCUITS

BACKGROUND OF THE INVENTION

The present invention relates to bipolar transistor logic circuits and more particularly to emitter coupled logic (ECL) circuits where pull-up delay and power consumption are reduced by using a direct-coupled pull-up scheme. Specifically, the circuit includes a PNP transistor as the pull-up device for the output node of the circuit, and the biasing of this PNP pull-up transistor is established entirely by direct tapping of the existing voltage levels in the ECL circuit, thus eliminating the need for extra biasing circuit.

The power dissipation of high-speed bipolar ECL circuits has long been known to limit their VLSI application. The power and speed limitation of the ECL circuits derives mainly from passive resistors in the delay path where the pull-up delay is limited by the collector load resistor and the pull-down delay is limited by the output emitter-follower resistor.

Recently, various active-pull-down schemes have been pursued in an effort to reduce the power consumption of the emitter-follower stage. Exemplary schemes are described, for example, in IBM Technical Disclosure Bulletin, entitled "High-Speed ECL Circuit", vol. 32, no. 4A, September 1989 pages 374–380; IBM Technical Disclosure Bulletin, entitled "High-Speed/Low-Power Charge-Buffered Active-Pull-Down ECL/NTL Circuits", vol. 33, no. 1A, June 1990, pages 470 to 472; IBM Technical Disclosure Bulletin entitled "High-Speed Low-Power ECL Circuit with an AC-Coupled Transient Current Source", vol. 33, no. 10B, March 1991, pages 31 to 33 and IBM Technical Disclosure Bulletin entitled "High-Speed, Low-Power ECL Circuit With a Darlington-Like Transient Current Source and Active-Pull-Down Driving Stage", vol. 33, no. 11, April 1991, pages 252 to 254.

These active-pull-down schemes, in general, improves the pull-down delay by replacing the emitter-follower resistor with active devices. The pull-up delay, however, is still limited by the collector load resistor and a substantial amount of power is still needed in the current switch to achieve fast switching. While an ac-coupled complementary push-pull configuration has been disclosed in U.S. Pat. No. 5,089,724 entitled "High-Speed Low-Power ECL/NTL Circuits With AC-Coupled Complementary Push-Pull Output Stage" and assigned to the same assignee as the present invention, to decouple the collector load resistor from the delay path, the approach utilizes capacitor coupling and requires careful design and extra biasing circuit for the push-and-pull transistor.

SUMMARY OF THE INVENTION

In accordance with the teachings of the present invention, the collector of a PNP transistor is connected to the output terminal of the ECL circuit, the base of the PNP transistor is connected via a diode to the common-emitter node of the ECL switching transistor pair and the emitter of the PNP transistor is connected to the in-phase collector node of the switching transistor. The PNP transistor and the diode are biased near the "cut in" condition when the input signal to the ECL circuit is at a logical high level voltage. The basic principle and operation of the circuit relies upon the dynamic current through the PNP transistor being used to directly pull up the output node of the circuit when the input signal goes down to the logical low level voltage. Moreover, the biasing of the PNP transistor is established by direct tapping of the existing voltage levels in the ECL circuit, and there is no extra biasing circuit for the PNP transistor.

A principal object of the present invention is therefore, the provision of a direct-coupled PNP transistor pull-up arrangement for ECL circuits. Another object of the present invention is the provision of a direct-coupled complementary push-pull arrangement for ECL circuits.

A further object of the present invention is the provision of PNP pull-up arrangement and complementary push-pull arrangement for ECL circuits with no extra biasing circuit and power.

Further and still other objects of the present invention will become more clearly apparent when the following description is read in conjunction with the accompanying drawings.

DETAILED DESCRIPTION

Figure 1:
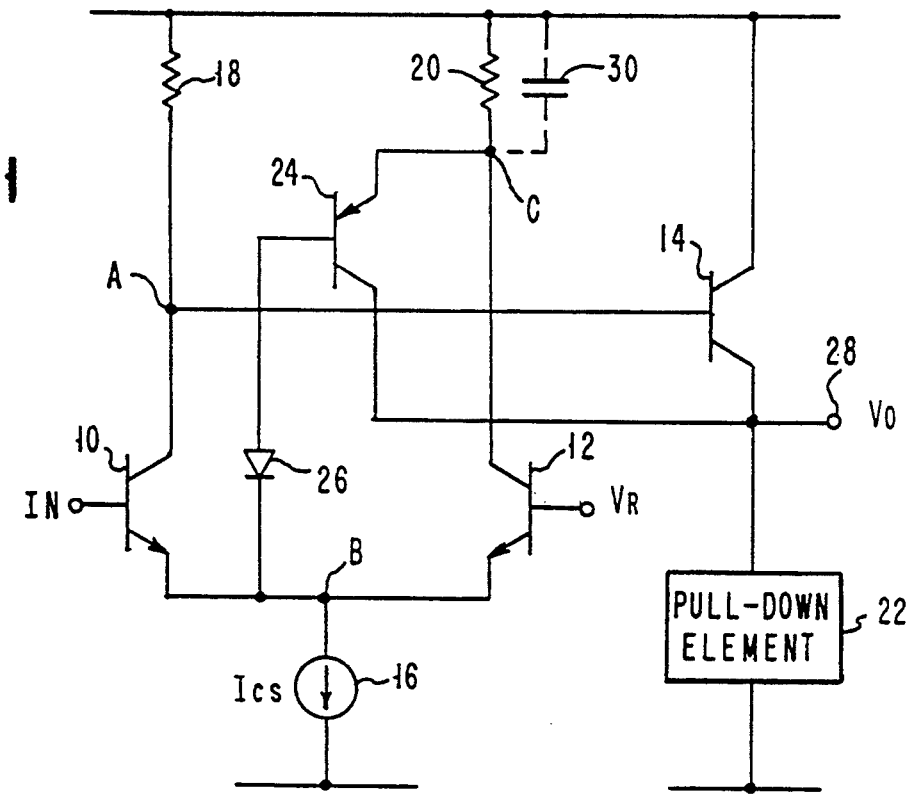
FIG. 1 is a schematic diagram of a direct-coupled PNP transistor pull-up ECL circuit embodying the present invention.

Referring now to the figures and to FIG. 1 in particular, there is shown a ECL circuit embodying the present invention. In a conventional ECL circuit the input signal is applied to an input terminal connected to the base of NPN transistor 10 which is differentially coupled to NPN transistor 12. The output of the transistor pair is taken from node A and is applied to the base of emitter follower 14. The base of NPN transistor 12 is connected to a reference voltage $V_R$ which is equal to the median between the logical high voltage and the logical low voltage of the integrated circuit. A current source 16, as is known in the art, is connected between node B which is connected to the emitters of transistors 10 and 12 and to a low voltage potential. Resistor 18 is connected between the collector of NPN transistor 10 and a high voltage potential. A resistor 20 is connected between the collector of transistor 12 and the high voltage potential. The output signal $V_o$ of the ECL circuit is manifest at an output terminal 28 connected to the emitter of NPN transistor 14.

In operation, when the input at the base of NPN transistor 10 is a logical low voltage, NPN transistor 10 is off and NPN transistor 12 is on. The current through current source 16 flows through NPN transistor 12. The voltage at the emitter of NPN transistor 14, which transistor is configured as an emitter follower, is at a high output voltage.

When the input signal at the base of NPN transistor 10 rises toward a logical high voltage, NPN transistor 10 will turn on and NPN transistor 12 will turn off when the input signal exceeds the reference voltage $V_R$. As transistor 10 turns on, node A will change from a high voltage level to a low voltage level. Consequently, the output voltage $V_o$ will be pulled down to a logical low output voltage. The output voltage $V_o$ is pulled down through a pull-down element 22 of a type known in the art and described, for example, in the references cited hereinabove. The pull-down element 22 is connected between the emitter of NPN transistor 14 and the low voltage potential.

When the input signal at the base of NPN transistor 10 falls from a logical high voltage to a logical low voltage, the NPN transistor 10 switches off and NPN transistor 12 switches on. As the NPN transistor 10 turns off, the node A changes from a logical low voltage to a logical high voltage. The base of NPN transistor 14 is pulled high to charge the output node and provide a logical high output voltage $V_o$ at the output terminal 28.

In a conventional ECL circuit, the pull-up speed is limited by the need to provide the drive current for NPN transistor 14 through resistor 18. The speed of the ECL circuit is further limited by the switch current $I_{cs}$ through current source 16 being the same whether it is flowing through resistor 20 and NPN transistor 12 or through resistor 18 and NPN transistor 10. Thus, resistor 18 and resistor 20 are generally of the same magnitude. The time required to pull up the output signal is determined by the time required for the input signal to fall from a logical high voltage to $V_R$ and the time required to pull up the voltage at node A through resistor 18 which determines the time needed to pull up the output voltage through the emitter-follower transistor 14.

In accordance with the present invention, a PNP transistor 24 and a diode 26 is added to the conventional ECL circuit. The emitter of PNP transistor 24 is connected to the node C connecting resistor 20 and the collector of NPN transistor 12. The collector of PNP transistor 24 is connected to the output terminal 28 of the ECL circuit. The base of PNP transistor 24 is connected to the anode of diode 26. The cathode of diode 26 is connected to node B at the connection of the emitters of NPN transistor 10 and NPN transistor 12. The PNP transistor 24 and diode 26 are biased at near "cut-in" condition, i.e., with essentially no dc current, when the input signal to the ECL circuit is at a logical high level voltage.

The bias of the PNP transistor is established naturally by the voltage difference across Node C and Node B since $$V_C = V_{CC} = V_{O,High} + V_{BE,Q14}$$

$$V_B = V_{IN,High} - V_{BE,Q10}$$

when the input is 'High'. Therefore, $$V_C - V_B = V_{BE,Q14} + V_{BE,Q10}$$

and there is a voltage drop of $2V_{BE}$ across the PNP transistor 24 and diode 26. The collector load resistor 20 serves to limit the (standby) current through the PNP transistor 24.

When the input falls from 'High' to 'Low', the voltage at Node B follows immediately. Since the voltage at Node C will remain at $V_{CC}$ until the current switch switches, the voltage drop across Node C and Node B will increase momentarily, resulting in base-emitter over-drive for PNP transistor 24 and diode 26 and thus large dynamic current through PNP transistor 24 to charge up the output terminal 28. Notice that:

(1) the biasing of the pull-up PNP transistor is established entirely by direct tapping (hence the name 'direct-coupled') the existing voltage levels in the current switch, (2) the large dynamic pull-up current is available way before the current switch switches, (3) the maximum base-emitter voltage over-drive for PNP transistor 24 and diode 26 is $\Delta V/2 (\Delta V/4$ for individual device), where $\Delta V$ is the logic swing, due to the emitter dotted-OR configuration of the input transistor 10 and the reference transistor 12, and (4) the dynamic current is drawn from Node C. Thus the voltage at Node C will decrease as the dynamic current increases, providing a self-terminating action to ensure a sharp dynamic current pulse during the transient.

Once the input crosses the reference voltage $V_R$, the current switch switches and the voltage at Node C will be pulled down by the switching current through the reference transistor 12. At the final steady-state (with the input at 'Low' now), the voltage at Node C drops by an amount equal to the voltage swing $\Delta V$ while the voltage at Node B drops only by $\Delta V/2$. The voltage difference between Node C and Node B thus decreases by $\Delta V/2$ and the PNP transistor 24 and diode 26 are now at cut-off.

When the input rises from 'Low' to 'High', the voltage at node B follows immediately once the input crosses the reference voltage $V_R$. PNP transistor 24 and diode 26 remain at cut-off initially until Node C is pulled up through the collector load resistor 20. As the voltage at Node C rises to approach its steady-state value of $V_{CC}$, and PNP transistor 24 and diode 26 enters the near 'cut-in' condition as described previously.

The bias across the PNP transistor 24 and diode 26 can be changed by tapping the voltage at different point of resistor 20 (instead of connecting the emitter of the PNP transistor 24 to node C as shown in FIG. 1).

A capacitor 30 can be added in parallel across resistor 20 to provide a large dynamic current through PNP transistor 24 to improve the switching speed.

Figure 2:
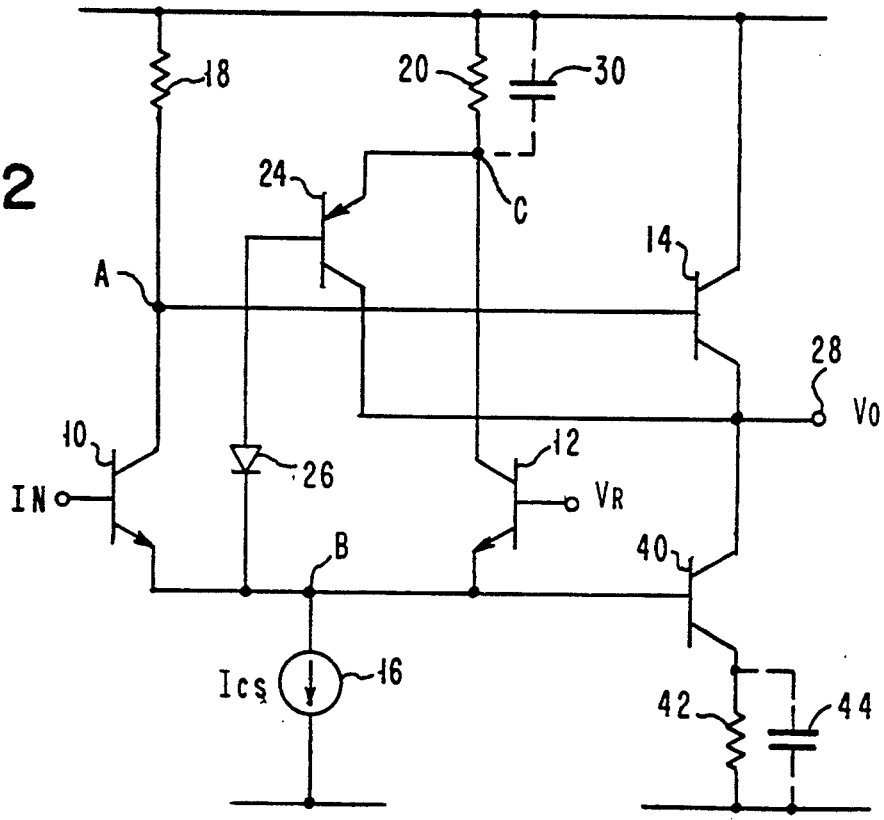
FIG. 2 is a schematic diagram of a direct-coupled complementary push-pull ECL circuit embodying the present invention.

FIG. 2 is a schematic diagram of a complementary push-pull ECL circuit utilizing the described direct-coupled PNP pull-up scheme. An active-pull-down NPN transistor 40 forms a Darlington-like configuration with NPN transistor 10. The bias of NPN transistor 40 is established by resistor 42. A capacitor 44 may be added in parallel with resistor 42 as a speed-up capacitor for transistor 40. The transistor 40 and resistor 42 form a pull-down element such as that shown in FIG. 1.

The inclusion of pull up PNP transistor 24 and diode 26 between nodes B and C as shown in conjunction with the circuit in FIG. 1, improves the pull-up delay and power consumption in direct-coupled complementary push-pull ECL circuits in the same manner as that described in conjunction with the conventional ECL circuit shown in FIG. 1.

While there has been described and illustrated preferred embodiments of the present invention, it will be apparent to those skilled in the art that modifications and variations are possible without deviating from the spirit and broad scope of the invention which shall be limited solely by the scope of the claims appended hereto.

What is claimed is:

1. An emitter coupled logic circuit comprising a first NPN transistor having a base connected to an input terminal, a second NPN transistor having an emitter connected to an emitter of the first NPN transistor and a base connected to receive a reference voltage, a constant current source connected between a low voltage line and the connection of the emitters of said first and said second NPN transistors, a collector of said first NPN transistor being connected to a high voltage line via a first resistor, a collector of said second NPN transistor being connected to a high voltage line via a second resistor, a third NPN transistor having a base connected to the collector of said first NPN transistor and a collector connected to said high voltage line and an emitter connected to an output terminal, a pull-down element connected between the output terminal and said low voltage line wherein the improvement comprises:

a PNP transistor having an emitter connected to the collector of said second NPN transistor, a collector connected to said output terminal and a base; and a diode having an anode connected to the base of said PNP transistor and a cathode connected to the connection of the emitters of said first and said second NPN transistors.

2. An emitter coupled logic circuit as set forth in claim 1, wherein said PNP transistor and said diode are biased at their respective cut-in conditions when the input signal at the input terminal is at a logical high level voltage.

3. An emitter coupled logic circuit as set forth in claim 1, further comprising a capacitor connected in parallel across said second resistor.

4. An emitter coupled logic circuit comprising a first NPN transistor having a base connected to an input terminal, a second NPN transistor having an emitter connected to an emitter of said first NPN transistor and a base connected to receive a reference voltage, a constant current source connected between a low voltage line and the connection of the emitters of said first and said second NPN transistors, a first resistor connected between a collector of said first NPN transistor and a high voltage line, a second resistor connected between a collector of said second NPN transistor and said high voltage line, a third NPN transistor having a base connected to said collector of said first NPN transistor, a collector connected to said high voltage line, and an emitter connected to an output terminal, a fourth NPN transistor having a collector connected to said output terminal, a base connected to the connection of the emitters of said first and said second NPN transistors, and an emitter, a third resistor connected between the emitter of said fourth NPN transistor and the low voltage line wherein the improvement comprises:

a PNP transistor having an emitter connected to the collector of said second NPN transistor, a collector connected to the output terminal and a base; and a diode having an anode connected to the base of said PNP transistor and a cathode connected to the connection of the emitters of said first and said second NPN transistors.

5. An emitter coupled logic circuit as set forth in claim 4 wherein said PNP transistor and said diode are biased at their respective cut-in condition when the input signal at the input terminal is a logical high level voltage.

6. An emitter coupled logic circuit as set forth in claim 4 further comprising a first capacitor connected in parallel across said second resistor.

7. An emitter coupled logic circuit as set forth in claim 6, further comprising a second capacitor connected in parallel across the third resistor.

8. An emitter coupled logic circuit as set forth in claim 4, further comprising a second capacitor connected in parallel across the third resistor.

* * * * *